United States Patent
Fukuda

(10) Patent No.: US 9,252,810 B2
(45) Date of Patent: Feb. 2, 2016

(54) MEMORY SYSTEM AND METHOD OF CONTROLLING MEMORY SYSTEM

(71) Applicant: Kabushiki Kaisha Toshiba, Minato-ku (JP)

(72) Inventor: Tohru Fukuda, Nishitokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/445,229

(22) Filed: Jul. 29, 2014

(65) Prior Publication Data

US 2015/0236716 A1    Aug. 20, 2015

Related U.S. Application Data

(60) Provisional application No. 61/942,269, filed on Feb. 20, 2014.

(51) Int. Cl.
*G11C 29/00* (2006.01)
*H03M 13/00* (2006.01)
*G06F 13/00* (2006.01)
*H03M 13/05* (2006.01)
*G06F 11/07* (2006.01)

(52) U.S. Cl.
CPC .............. *H03M 13/05* (2013.01); *G06F 11/073* (2013.01); *H03M 13/6566* (2013.01)

(58) Field of Classification Search
CPC ... G06F 11/1044; G06F 11/073; G11C 29/74; H03M 9/00; H03M 13/05; H03M 13/6566
USPC ......... 714/769, 770, 772, 757–758, 766–767, 714/799–800; 711/46, 102–105, 154
See application file for complete search history.

(56) References Cited

U.S. PATENT DOCUMENTS

| | | | |
|---|---|---|---|
| 7,203,891 B2 * | 4/2007 | Lee | G11B 7/007 365/185.09 |
| 8,041,884 B2 * | 10/2011 | Chang | G11C 16/10 365/185.33 |
| 8,397,127 B2 | 3/2013 | Otsuka | |
| 2010/0161883 A1 | 6/2010 | Kurashige | |
| 2012/0072680 A1 | 3/2012 | Kimura et al. | |
| 2013/0346671 A1 * | 12/2013 | Michael | G06F 12/0246 711/103 |

FOREIGN PATENT DOCUMENTS

| | | |
|---|---|---|
| JP | 4439578 | 3/2010 |
| JP | 2011-134307 | 7/2011 |
| JP | 2012-68862 | 4/2012 |
| JP | 2013-101455 | 5/2013 |

* cited by examiner

*Primary Examiner* — Christine Tu
(74) *Attorney, Agent, or Firm* — Oblon, McClelland, Maier & Neustadt, L.L.P.

(57) ABSTRACT

According to one embodiment, a controller writes first write data transferred from a first buffer and code data for second write data different from the first write data, the code data being transferred from a second buffer, in parallel to a plurality of physical pages corresponding to a first logical page. The controller writes code data for the first write data to a physical page corresponding to a second logical page, the second logical page being next to the first logical page, at a time of write to the nonvolatile memory following the write of the first write data and the code data for the second write data.

14 Claims, 6 Drawing Sheets

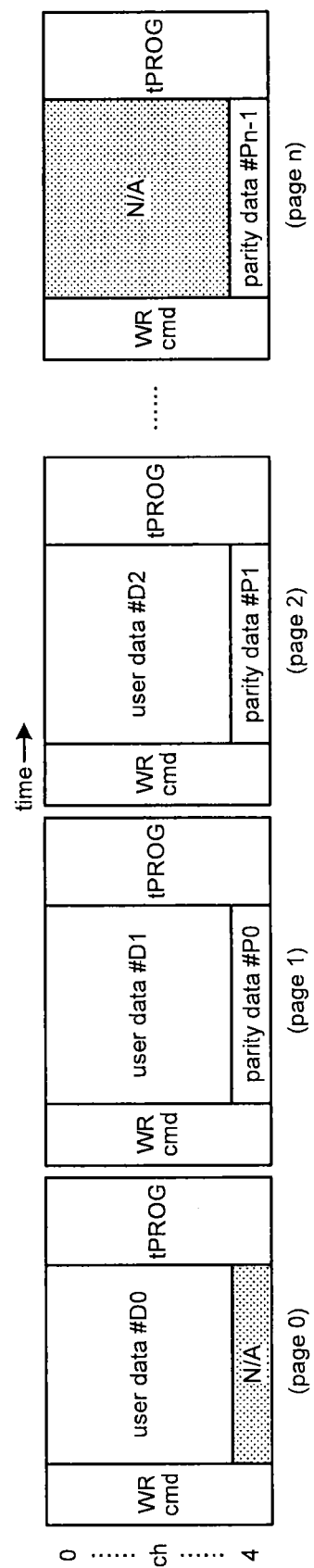

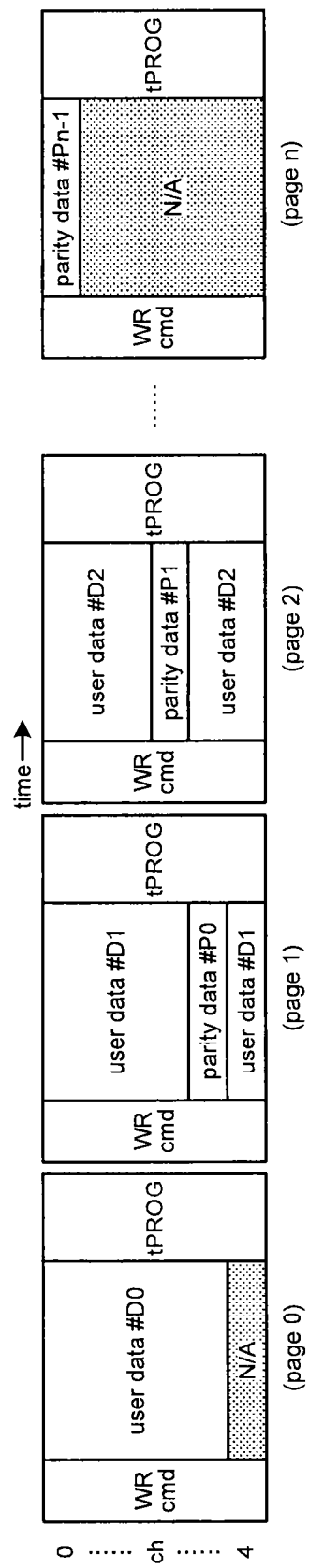

MEMORY SYSTEM AND METHOD OF CONTROLLING MEMORY SYSTEM

CROSS-REFERENCE TO RELATED APPLICATIONS

This application is based upon and claims the benefit of priority from U.S. Provisional Patent Application No. 61/942,269, filed on Feb. 20, 2014; the entire contents of which are incorporated herein by reference.

FIELD

Embodiments described herein relate generally to a memory system includes a nonvolatile memory and a method of controlling the memory system.

BACKGROUND

In a storage using a flash memory, a plurality of memory chips is distributed to a plurality of channels and the channels are driven in parallel to enhance data transfer performance. Physical blocks are collected from the channels, respectively, and a logical block serving as a virtual block is constructed of the collected physical blocks. The logical block is a unit of management such as erasure and wear leveling. A physical page is selected from each of the physical blocks constituting the logical block and a logical page serving as a virtual page is constructed of the selected physical pages. The logical page is a unit of read and a unit of write.

This type of storages adopts an inter-channel error correction code (ECC) for creating a redundant code from data distributed and stored in the memory chips (the channels) to relieve defects in the memory chips. In the inter-channel ECC, when a redundant code is to be calculated, the redundant code is calculated using code source data stored in a buffer. After calculation of the redundant code is ended, the calculated redundant code and the code source data corresponding to the redundant code are transferred to the memory chips at the same time in parallel via the channels, so that write operations for the redundant code and the code source data corresponding to the redundant code are performed at the same time.

To transfer the redundant code and the code source data corresponding to the redundant code to the memory chips in parallel in this way, the code source data needs to be kept in the buffer while the redundant code is calculated, which increases the retention time of the code source data in the buffer and correspondingly increases the capacity of the buffer.

BRIEF DESCRIPTION OF THE DRAWINGS

FIG. 6 is a conceptual diagram illustrating an example of write of data and parities into a logical block according to the first embodiment; and FIG. 7 is a conceptual diagram illustrating an example of write of data and parities into a logical block according to a second embodiment.

DETAILED DESCRIPTION

In general, according to one embodiment, a memory system includes a nonvolatile memory, a first buffer, an ECC processing unit, a second buffer, and a controller. The nonvolatile memory has a plurality of memory units capable of parallel operations, each of the memory units has a plurality of physical blocks, each of the physical blocks being a unit of data erasing, each of the physical blocks having a plurality of physical pages. The first buffer buffers therein write data from a host device. The ECC processing unit creates code data from write data buffered in the first buffer. The second buffer buffers therein the code data created by the ECC processing unit. The controller associates physical blocks selected from each of the memory units capable of parallel operations with one logical block. The logical block includes a plurality of logical pages. The controller associates each of the logical pages with a plurality of physical pages having a same page number. The controller writes first write data transferred from the first buffer and code data for second write data different from the first write data, the code data being transferred from the second buffer, in parallel to the plurality of physical pages corresponding to a first logical page. The controller writes code data for the first write data to a physical page corresponding to a second logical page, the second logical page being next to the first logical page, at a time of write to the nonvolatile memory following the write of the first write data and the code data for the second write data.

Exemplary embodiments of a memory system and a method of controlling the memory system will be explained below in detail with reference to the accompanying drawings. The present invention is not limited to the following embodiments.

First Embodiment

Figure 1:
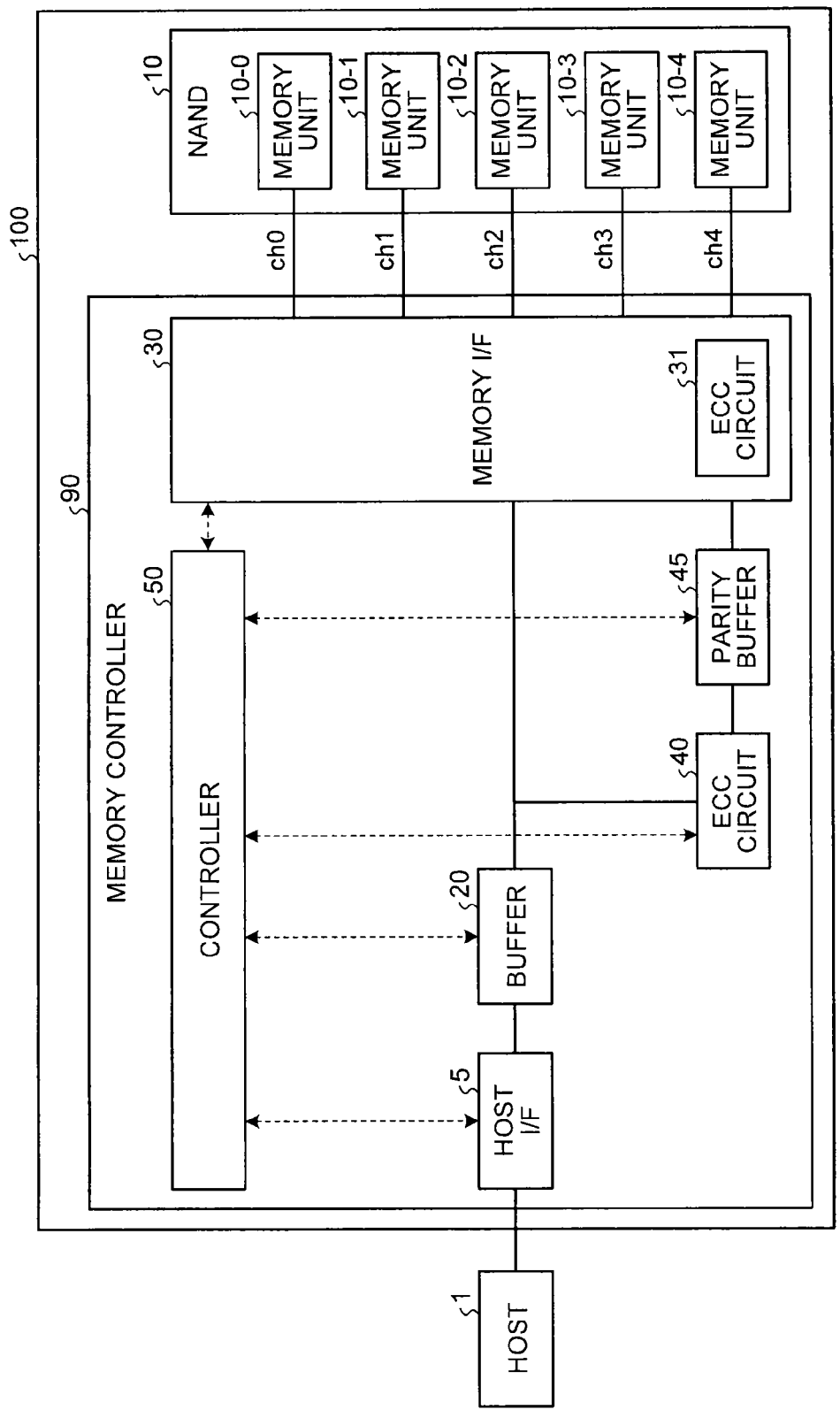
FIG. 1 is a block diagram illustrating a configuration example of a memory system according to a first embodiment.

FIG. 1 is a block diagram illustrating a configuration example of a memory system 100 according to a first embodiment. The memory system 100 is connected to a host device (hereinafter, "host") 1 via a host interface 5 and functions as an external storage device of the host 1. The host 1 is, for example, a personal computer, a mobile phone, or an imaging device. In FIG. 1, generally, a data line is shown by a solid line and a control line is shown by a broken line.

The memory system 100 includes a NAND flash memory (hereinafter, NAND) 10 as a nonvolatile memory and a memory controller 90 that controls the NAND 10. The memory controller 90 includes the host interface (host I/F) 5, a buffer 20 which is a RAM (Random Access Memory) or the like as a memory capable of a higher-speed access than the NAND 10, a memory interface (memory I/F) 30, an ECC circuit 40 serving as an ECC processing unit, a parity buffer 45, and a controller 50.

The NAND 10 stores therein user data specified by the host 1. The NAND 10 includes a plurality of memory chips. Each of the memory chips has a memory cell array in which a plurality of memory cells is arranged in a matrix. Each of the memory cells is capable of multilevel storage. In the memory cell array, a plurality of physical blocks each being a unit of data erasing is arranged. Each of the physical blocks includes a plurality of physical pages. Each of the physical pages is a unit of data write and data read.

In the present embodiment, the NAND 10 is connected to the memory I/F 30 via five channels (5ch: ch0 to ch4). The NAND 10 can operate five memory units 10-1 to 10-4 in parallel at the same time. The number of channels is not limited to five and an arbitrary number of channels can be used. Each of the memory units 10-0 to 10-4 includes the memory chip mentioned above or a plurality of the memory chips.

The host interface 5 performs communication of a command, data, a status report, and the like with the host 1.

The buffer 20 functions as a storage area for temporarily saving data when the data is written from the host 1 to the NAND 10. For example, a SRAM (Static Random Access Memory) or a DRAM (Dynamic Random Access Memory) is used as the buffer 20. The buffer 20 can be provided in a cache area in the NAND 10.

The memory I/F 30 executes a control on data transfer between the memory units 10-0 to 10-4 of the NAND 10 and the buffer 20. The memory I/F 30 has an ECC circuit 31. For data to be written in the NAND 10, the ECC circuit 31 generates an error detection code (a cyclic redundancy check (CRC) code, for example) and an error correction code (a hamming code, for example) with respect to each data of a predetermined unit, for example, data of a page size and attaches the generated codes to the data. The data attached with the error detection code and the ECC code is written in the NAND 10. When data is to be read from the NAND 10, the ECC circuit 31 performs error correction with the ECC code with respect to data of the predetermined unit read from the NAND 10 and then detects whether erroneous correction has occurred using the error detection code.

When it is determined that erroneous correction has occurred, that is, when errors more than a correction capability of the ECC code have occurred and erroneous correction has occurred, the ECC circuit 31 notifies the controller 50 of the fact. The controller 50 causes the ECC circuit 40 to perform ECC processing when receiving a notification of erroneous correction from the ECC circuit 31.

Figure 2:
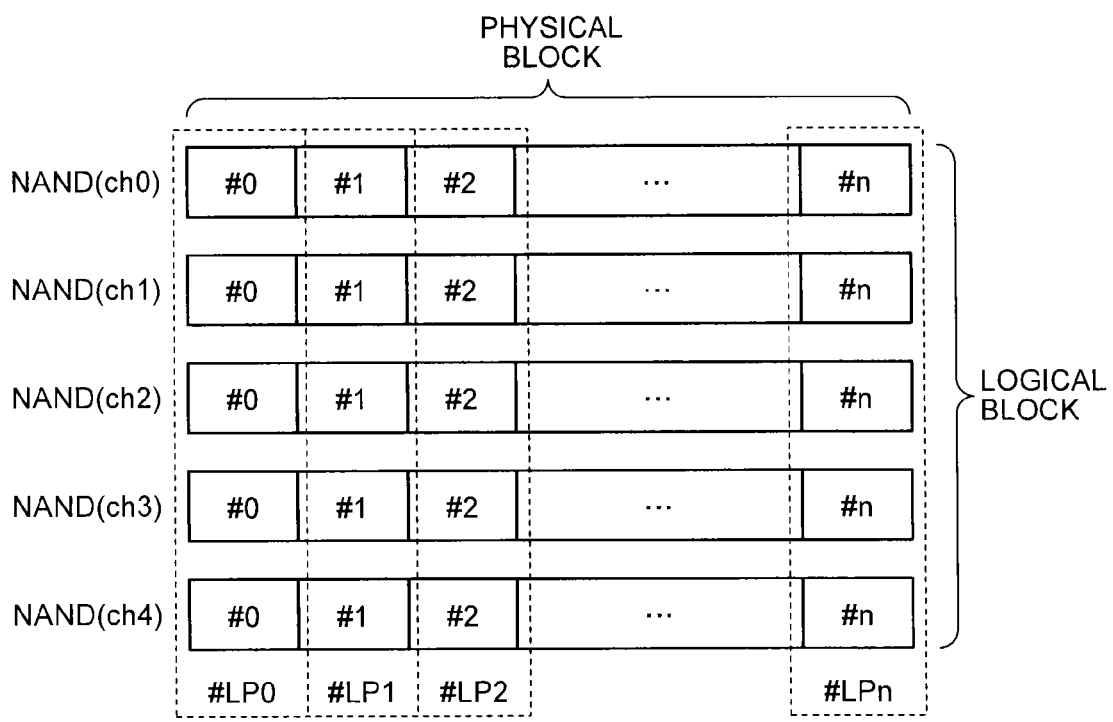
FIG. 2 is a conceptual diagram illustrating a plurality of physical pages included in a physical block.

In the memory system 100, a logical block as a virtual block is defined as a unit for managing a plurality of physical blocks in a lump. In the present embodiment, the logical block is obtained by combining physical blocks to enable channel parallel. FIG. 2 illustrates one logical block in the NAND 10. This logical block is composed of a collection of five physical blocks each being selected from each of the channels ch0 to ch4. Each of the physical blocks is composed of n+1 (n is a natural number equal to or larger than 2) pages from a physical page #0 having a page number 0 to a physical page #n having a page number n.

The physical pages #0 having the page number 0 are selected from the physical blocks of the channels ch0 to ch4, respectively, and a first logical page #LP0 is composed of the selected five physical pages #0. Similarly, the physical pages #1 having the page number 1 are selected from the physical blocks of the channels ch0 to ch4, respectively, and a logical page #LP1 is composed of the selected five physical pages #1. . . . . Similarly, the physical pages #n having the page number n are selected from the physical blocks of the channels ch0 to ch4, respectively, and a last logical page #LPn is composed of the selected five physical pages #n. In this way, each of the logical pages is composed of a collection of physical pages having the same page number.

In the logical block, write is performed in the ascending order of the page numbers. That is, write is performed in a temporal order from the logical page #LP0→the logical page #LP1→the logical page #LP2→ . . . the logical page #LPn.

The ECC circuit 40 performs encoding processing of the ECC processing using write data buffered in the buffer 20. The ECC circuit 40 has an error correction capability higher than that of the ECC circuit 31. Cyclic codes such as an RS (Read-Solomon) code and a BCH (Bose-Chaudhuri-Hocquenghem) code and a parity calculated from an exclusive OR are adopted in the ECC circuit 40 as error-correction coding methods. Redundant code data obtained by these error-correction coding methods is hereinafter collectively referred to as "parity data". The ECC circuit 40 adopts an inter-channel error correction code for creating parity data as a redundant code from data distributed and stored in the channels. In other words, the ECC circuit 40 adopts an inter-chip error correction code for creating parity data from data distributed and stored in the memory chips.

During data transfer from the buffer 20 to the memory I/F 30, the ECC circuit 40 performs the encoding processing while using data that is being transferred, in other words, snooping the data that is being transferred. When notified from the controller 50 of a fact that occurrence of an error in data read from the NAND 10 is detected, the ECC circuit 40 performs a decoding operation to correct the error using write data distributed and stored in the channels and the parity data.

The parity buffer 45 buffers therein the parity data created by the ECC circuit 40 and transfers the buffered parity to the memory I/F 30. For example, a SRAM (Static Random Access Memory) or a DRAM (Dynamic Random Access Memory) is used as the parity buffer 45. The parity buffer 45 can be provided in a cache area in the NAND 10.

The controller 50 is a processor that reads system programs stored in the NAND 10 into a main storage unit (not shown) to execute the programs and realizes various management functions by executing the system programs. The controller 50 interprets a command received from the host 1 via the host I/F 5 and controls constituent elements such as the host I/F 5, the buffer 20, the ECC circuit 40, the parity buffer 45, and the memory I/F 30 according to the interpreted command, thereby controlling write of data into the NAND 10 or read of data from the NAND 10.

The controller 50 manages at which position in which physical block on the NAND 10 data is to be stored. The controller 50 has an address conversion table that manages a correspondence between logical addresses supplied from the host 1 and physical positions on the NAND 10 and performs organization of the NAND 10, such as garbage collection or compaction according to a use situation of blocks on the NAND.

Figure 3:
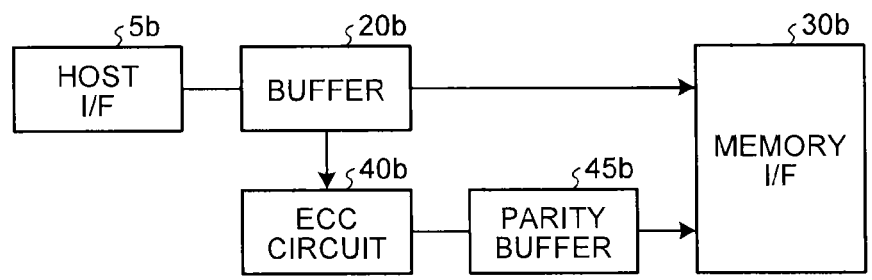
FIG. 3 illustrates a configuration of a comparative example.

FIG. 3 illustrates a configuration of a comparative example. In the comparative example, when an inter-channel ECC is to be calculated, an ECC circuit 40b calculates a parity using code source data buffered in a buffer 20b and buffers the calculated parity in a parity buffer 45b when the calculation is ended. The code source data buffered in the buffer 20b and the parity buffered in the parity buffer 45b are transmitted to a memory I/F 30b at the same time. The memory I/F 30b transfers the code source data and the parity to memory chips at the same time in parallel via a plurality of channels, respectively, to perform write operations for the parity and the code source data corresponding to the parity at the same time.

Figure 4:
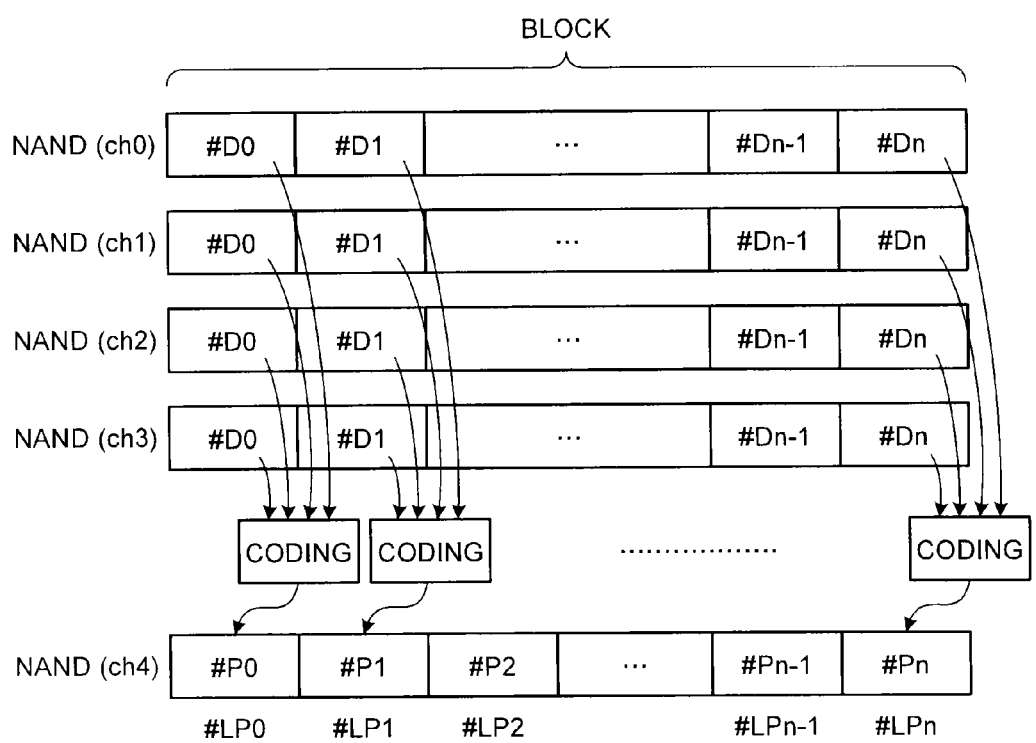
FIG. 4 is a conceptual diagram illustrating an example of write of data and parities into a logical page according to the comparative example.

FIG. 4 illustrates a concept of distributed storage of code source data and parities in the NAND 10 according to a comparative example. As shown in FIG. 4, in the comparative example, code source data and parities are written to be distributed to physical pages belonging to same logical pages. That is, a parity #Pn is created using data #Dn, #Dn, and

Dn of four channels ch0 to ch3, written in physical pages #n having a page number n and belonging to a logical page #LPn, and the created parity #Pn is written in a physical page #n of a channel ch4 belonging to the logical page #LPn.

In the comparative example, to transfer a parity and code source data corresponding to the parity to memory chips in parallel at the same time, the code source data needs to be kept in the buffer 20b while the parity is calculated in the ECC circuit 40b. Accordingly, in the comparative example, the retention time of the code source data in the buffer 20b becomes longer and correspondingly the buffer 20b requires a larger capacity.

In the present embodiment, code source data and the corresponding parity are not written in physical pages belonging to a same logical page and the parity is written in the next logical page to a logical page in which the code source data is written. In other words, when code source data is written in a logical page having a page number m, a parity created using the code source data is written in a logical page having a page number m+1.

Figure 5:
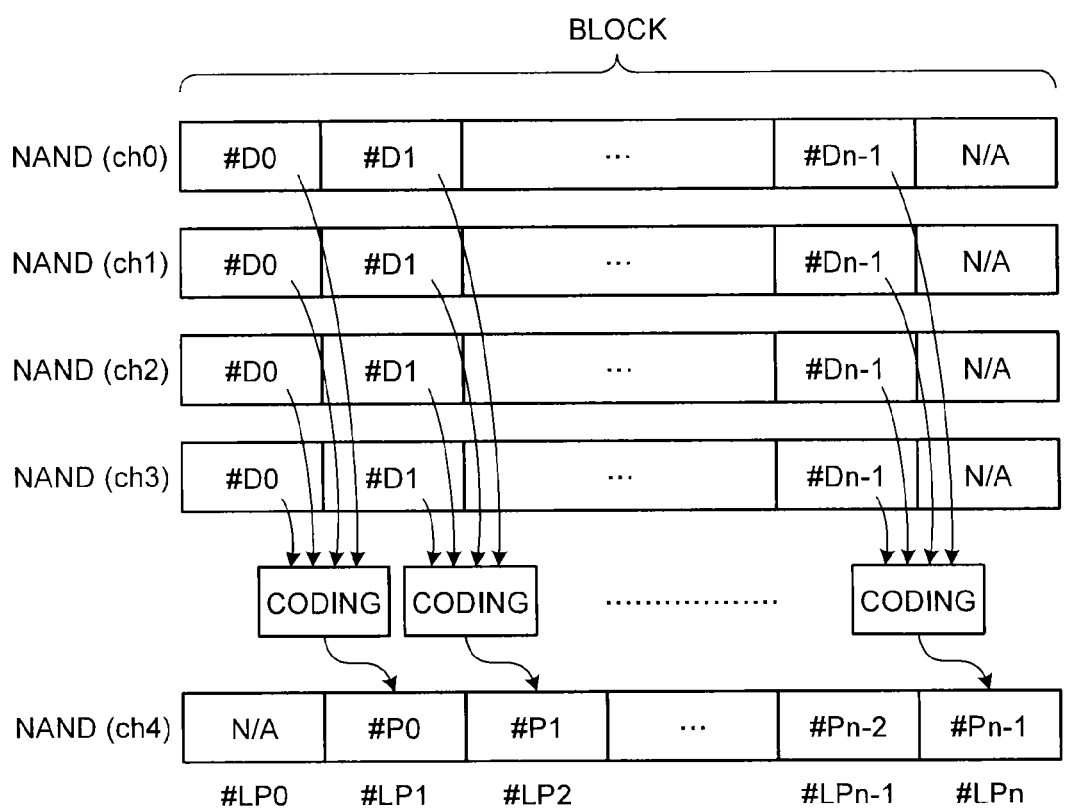
FIG. 5 is a conceptual diagram illustrating an example of write of data and parities into a logical page according to the first embodiment.

FIG. 5 illustrates a concept of distributed storage of code source data and parities in the NAND 10 according to the present embodiment. A parity #P0 is created using four pieces of data #D0, #D0, #D0, and #D0 of the channels ch0 to ch3, which are written in physical pages #0 having a page number 0 and belonging to a first logical page #LP0, and the created parity #P0 is written in a physical page #1 of a page number 1 in the channel ch4 belonging to the next logical page #LP1. Similarly, a parity #P1 is created using four pieces of data #D1, #D1, #D1, and #D1 of the channels ch0 to ch3, which are written in physical pages #1 having a page number 1 and belonging to a logical page #LP1, and the parity #P1 is written in a physical page #2 of a page number 2 in the channel ch4 belonging to the next logical page #LP2. A parity #Pn−1 is created using four pieces of data #Dn−1, #Dn−1, #Dn−1, and #Dn−1 of the channels ch0 to ch3, which are written in physical pages #n−1 having a page number n−1 and belonging to a logical page #LPn−1, and the parity #Pn−1 is written in a physical page #n of a page number n in the channel ch4 belonging to the next logical page (the last logical page) #LPn.

As described above, in the present embodiment, each of parities is written in the next logical page to a logical page in which the corresponding code source data is written. In other words, write data, and parity data of which the code source is write data in the previous logical page, are written in the same logical page.

A first physical page #0 of the page number 0 belonging to the first logical page #LP0 in the channel ch4 in which parities are written becomes N/A (not available). Similarly, physical pages #n of the page number n belonging to the last logical page #LPn in the channels ch0 to ch3 in which data is written become N/A.

The controller 50 executes a control on data transfer from the buffer 20 to the memory I/F 30, a control on parity transfer from the parity buffer 45 to the memory I/F 30, and a control on the memory I/F 30 to enable the distributed storage as shown in FIG. 5.

Specifically, while the data #D1 to be written in the logical page #LP1 is transferred from the buffer 20 to the memory I/F 30, the controller 50 executes a control to cause the ECC circuit 40 to create the parity data #P1 for the data #D1 and to transfer the parity data #P0 for the data #D0 in the previous logical page #LP0 from the parity buffer 45 to the memory I/F 30. When creation of the parity data #P1 is ended, the ECC circuit 40 buffers the created parity data #P1 in the parity buffer 45. The memory I/F 30 performs transfer of the data #D1 received from the buffer 20 to the channels ch0 to ch3 and transfer of the parity data #P0 received from the parity buffer 45 to the channel ch4 at the same time and causes the NAND 10 to perform write of these pieces of data into the logical page #LP1 at the same time.

Similarly, while the data #D2 to be written in the logical page #LP2 is transferred from the buffer 20 to the memory I/F 30, the controller 50 executes a control to cause the ECC circuit 40 to create the parity data #P2 for the data #D2 and to transfer the parity data #P1 for the data #D1 of the previous logical page #LP1 from the parity buffer 45 to the memory I/F 30. The memory I/F 30 performs transfer of the data #D2 received from the buffer 20 to the channels ch0 to ch3 and transfer of the parity data #P1 received from the parity buffer 45 to the channel ch4 at the same time and causes the NAND 10 to perform write of these pieces of data into the logical page #LP2 at the same time.

FIG. 6 is a timing chart illustrating an example of write of data and parities into a logical block in the memory system 100 according to the present embodiment. The memory I/F 30 transmits a write command (WRcmd) including the address of a first page 0 to the channels ch0 to ch4 and then transmits user data #D0 to the channels ch0 to ch3. At the time of transmission of the user data #D0, the memory I/F 30 does not transmit parity data #P0 of which the code source is the user data #D0 to the channel ch4. As a result, the channel ch4 becomes N/A (not available). Corresponding memory chips in the memory units 10-0 to 10-4 perform program operations (denoted by tPROG in FIG. 6) to memory cells at the specified address, respectively. Consequently, the user data #D0 is written in the channels ch0 to ch3 of the logical page #LP0. No data is written in the channel ch4 of the logical page #LP0.

The memory I/F 30 then transmits a write command (WRcmd) including the address of a page 1 to the channels ch0 to ch4 and then transmits user data #D1 to the channels ch0 to ch3. The memory I/F 30 also transmits parity data #P0 of which the code source is the user data #D0 to the channel ch4. Corresponding memory chips in the memory units 10-0 to 10-4 perform program operations (denoted by tPROG in FIG. 6) to memory cells at the specified address, respectively. As a result, the user data #D1 is written in the channels ch0 to ch3 of the logical page #LP1 and the parity data #P0 is written in the channel ch4 thereof.

The memory I/F 30 then transmits a write command (WRcmd) including the address of a page 2 to the channels ch0 to ch4 and then transmits user data #D2 to the channels ch0 to ch3. The memory I/F 30 also transmits parity data #P1 of which the code source is the user data #D1 to the channel ch4. Corresponding memory chips in the memory units 10-0 to 10-4 perform program operations (denoted by tPROG in FIG. 6) to memory cells at the specified address, respectively. As a result, the user data #D2 is written in the channels ch0 to ch3 of the logical page #LP2 and the parity data #P1 is written in the channel ch4 thereof.

Similar processes are performed to the logical pages #LP3 to #LPn, respectively. The memory I/F 30 transmits a write command (WRcmd) including the address of a last page n to the channels ch0 to ch4 and then transmits parity data #Pn−1 of which the code source is the user data #Dn−1 to the channel c4 without transmitting any data to the channels ch0 to ch3. As a result, the channels ch0 to ch3 of the logical page #LPn become N/A (not available). Corresponding memory chips in the memory units 10-0 to 10-4 perform program operations (denoted by tPROG in FIG. 6) to memory cells at the specified address, respectively. Consequently, no data is written in the channels ch0 to ch3 of the logical page #LPn and the parity data #Pn−1 is written in the channel ch4 thereof.

When detecting that an error occurs in data of a logical page x read from the NAND 10, the controller 50 controls the memory I/F 30 and the ECC circuit 40 to read data of the logical page x and a parity of the next logical page x+1 to perform a decoding processing for error correction.

As described above, in the first embodiment, the control is executed to write coded data in the next logical page to a logical page in which the corresponding code source data is written. Accordingly, when encoding processing for error correction is performed during transfer of data from the buffer 20 to the memory I/F 30 while the data being transferred is snooped, only the parity buffer 45 that stores therein the coded data is required as a buffer related to the ECC processing. Therefore, a buffer for causing data to be waited until a parity is created in the ECC circuit 40b is not required for the buffer 20 and the capacity of a buffer for absorbing a speed difference between the host 1 and the NAND 10 suffices for the buffer 20. This reduces the capacity of the buffer 20 and can lower power consumption and apparatus costs.

Second Embodiment

FIG. 7 is a timing chart illustrating another example of write of data and parities into a logical block in the memory system 100 according to a second embodiment. In FIG. 7, the parities are stored to be distributed to a plurality of channels, respectively, without being fixedly arranged in a certain channel. Also in FIG. 7, each of the parities is written in the next logical page to a logical page in which the corresponding code source data is written.

In FIG. 7, the memory I/F 30 transmits a write command (WRcmd) including the address of a first page 0 to the channels ch0 to ch4 and then transmits user data #D0 to the channels ch0 to ch3. At the time of transmission of the user data #D0, the memory I/F 30 does not transmit parity data #P0 of which the code source is the user data #D0 to the channel ch4. As a result, the channel ch4 becomes N/A (not available). Corresponding memory chips in the memory units 10-0 to 10-4 perform program operations (denoted by tPROG in FIG. 7) to memory cells at the specified address, respectively. Consequently, the user data #D0 is written in the channels ch0 to ch3 of the logical page #LP0. No data is written in the channel ch4 of the logical page #LP0.

The memory I/F 30 then transmits a write command (WRcmd) including the address of a page 1 to the channels ch0 to ch2 and ch4 and then transmits user data #D1 to the channels ch0 to ch2 and ch4. The memory I/F 30 also transmits parity data #P0 of which the code source is the user data #D0 to the channel ch3. Corresponding memory chips in the memory units 10-0 to 10-4 perform program operations (denoted by tPROG in FIG. 7) to memory cells at the specified address, respectively. As a result, the user data #D1 is written in the channels ch0 to ch2 and ch4 of the logical page #LP1 and the parity #P0 is written in the channel ch3 thereof.

The memory I/F 30 then transmits a write command (WRcmd) including the address of a page 2 to the channels ch0, ch1, ch3, and ch4 and then transmits user data #D2 to the channels ch0, ch1, ch3, and ch4. The memory I/F 301 transmits parity data #P1 of which the code source is the user data #D1 to the channel ch2. Corresponding memory chips in the memory units 10-0 to 10-4 perform program operations (denoted by tPROG in FIG. 7) to memory cells at the specified address, respectively. As a result, the user data #D2 is written in the channels ch0, ch1, ch3, and ch4 of the logical page #LP2 and the parity #P1 is written in the channel ch2 thereof.

Similar processes are performed to the logical pages #LP3 to #LPn, respectively. The memory I/F 30 transmits a write command (WRcmd) including the address of a last page n to the channels ch0 to ch4 and then transmits parity data #Pn−1 of which the code source is the user data #Dn−1 to the channel ch0 while transmitting no data to the channels ch1 to ch4. As a result, the channels ch1 to ch4 of the logical page #LPn become N/A (not available). Corresponding memory chips in the memory units 10-0 to 10-4 perform program operations (denoted by tPROG in FIG. 7) to memory cells at the specified address, respectively. As a result, no data is written in the channels ch1 to ch4 of the logical page #LPn while the parity #Pn−1 is written in the channel ch0 thereof.

As described above, in the second embodiment, the parities are stored to be distributed to the channels, respectively, so that the reliability in error correction is enhanced and a higher-speed access is enabled. When only snooping by the ECC circuit 40 is performed without executing a control to write the write data #Dn and the parity data #Pn−1 at the same time as in the present embodiment, a time difference always occurs between a write completion time of physical pages to which the write data #Dn is written and a write completion time of a physical page to which the parity data #Pn is written. Accordingly, when only snooping by the ECC circuit 40 is performed, it is necessary to adjust with which write completion time of the host data or the parity a time to perform various management processes (such as an update of address management information and a buffer releasing process), which are to be performed after completion of write into the logical pages, is to be matched and thus the management becomes complicated. Therefore, when only snooping by the ECC circuit 40 is performed, the control to store the parities to be distributed to the channels as in the second embodiment cannot be executed.

The logical block is composed of a collection of physical blocks each being selected from the memory chips of each channel in the embodiments described above. However, when each of the memory chips is divided into a plurality of planes, the logical block can be composed of a collection of physical blocks each being selected from the planes of each memory chip. Each of the planes has a plurality of physical blocks. The planes include peripheral circuits (a row decoder, a column decoder, a page buffer, and a data cache, for example) independent of each other, respectively, and can perform erasure/write/read at the same time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a nonvolatile memory having a plurality of memory units capable of parallel operations, each of the memory units having a plurality of physical blocks, each of the physical blocks being a unit of data erasing, each of the physical blocks having a plurality of physical pages;
    a first buffer that buffers therein write data from a host device;
    an ECC processing unit that creates code data from write data buffered in the first buffer;
    a second buffer that buffers therein the code data created by the ECC processing unit; and a controller configured to associate physical blocks selected from each of the memory units capable of parallel operations with one logical block, the logical block including a plurality of logical pages, associate each of the logical pages with a plurality of physical pages having a same page number, write first write data transferred from the first buffer and the code data for second write data different from the first write data, the code data being transferred from the second buffer, in parallel to the plurality of physical pages corresponding to a first logical page, and write the code data for the first write data to a physical page corresponding to a second logical page, the second logical page being next to the first logical page, at a time of write to the nonvolatile memory following the write of the first write data and the code data for the second write data.

2. The memory system according to claim 1, wherein the ECC processing unit snoops write data to be transferred from the first buffer and creates code data using the snooped write data.

3. The memory system according to claim 1, wherein the code data is stored to be distributed to the plurality of memory units.

4. The memory system according to claim 1, wherein the code data is fixedly stored in one of the memory units.

5. The memory system according to claim 1, wherein an ECC method adopted in the ECC processing unit generates a cyclic code.

6. The memory system according to claim 1, wherein in an ECC method adopted in the ECC processing unit, a parity is calculated by an exclusive OR.

7. The memory system according to claim 1, wherein each of the first buffer and the second buffer is a DRAM, a SRAM, or a cache area in the nonvolatile memory.

8. A method of controlling a memory system, the memory system including a nonvolatile memory having a plurality of memory units capable of parallel operations, each of the memory units having a plurality of physical blocks, each of the physical blocks being a unit of data erasing, each of the physical blocks having a plurality of physical pages, a first buffer, and a second buffer, the method comprising buffering write data from a host device to the first buffer, creating code data from the write data buffered in the first buffer and buffering the code data to the second buffer, associating physical blocks selected from each of the memory units capable of parallel operations with one logical block, the logical block including a plurality of logical pages, associating each of the logical pages with a plurality of physical pages having a same page number, writing first write data transferred from the first buffer and the code data for second write data different from the first write data, the code data being transferred from the second buffer, in parallel to the plurality of physical pages corresponding to a first logical page, and writing the code data for the first write data to a physical page corresponding to a second logical page, the second logical page being next to the first logical page, at a time of write to the nonvolatile memory following the write of the first write data and the code data for the second write data.

9. The method of controlling a memory system according to claim 8, further comprising snooping write data to be transferred from the first buffer and creating code data using snooped write data.

10. The method of controlling a memory system according to claim 8, wherein the code data is stored to be distributed to the plurality of memory units.

11. The method of controlling a memory system according to claim 8, wherein the code data is fixedly stored in one of the memory units.

12. The method of controlling a memory system according to claim 8, wherein the code data is a cyclic code data.

13. The method of controlling a memory system according to claim 8, wherein the code data is a parity data calculated by an exclusive OR.

14. The method of controlling a memory system according to claim 8, wherein each of the first buffer and the second buffer is a DRAM, a SRAM, or a cache area in the nonvolatile memory.

* * * * *